United States Patent [19]

Jindrick et al.

[11] Patent Number: 4,683,550
[45] Date of Patent: Jul. 28, 1987

[54] PERSONAL COMPUTER INSTRUMENTATION SYSTEM INCLUDING CARRIER BOARD HAVING BUS-ORIENTED PLUG-IN INSTRUMENTATION MODULES

[75] Inventors: James A. Jindrick; Shashikant M. Patil; Margaret S. Morrison; Littleton D. Page, all of Tucson, Ariz.

[73] Assignee: Burr-Brown Corporation, Tucson, Ariz.

[21] Appl. No.: 634,999

[22] Filed: Jul. 30, 1984

[51] Int. Cl.[4] .............................................. G06F 9/02
[52] U.S. Cl. ................................... 364/900; 361/413; 364/709
[58] Field of Search ............... 361/339, 413; 364/709, 364/900 MS File, 200

[56] References Cited

U.S. PATENT DOCUMENTS

| | | | |
|---|---|---|---|
| 4,032,893 | 7/1977 | Moran | 340/825.83 |
| 4,118,772 | 10/1978 | Takada | 364/200 |
| 4,424,559 | 1/1984 | Lorincz et al. | 364/172 |
| 4,477,862 | 10/1984 | Gonzales | 361/393 |
| 4,517,661 | 5/1985 | Graf | 364/900 |
| 4,530,069 | 7/1985 | Desrochers | 364/900 |
| 4,539,655 | 9/1985 | Frussell | 364/900 |
| 4,558,914 | 12/1985 | Prager | 361/413 |

Primary Examiner—Archie E. Williams, Jr.
Assistant Examiner—Emily Yue Chan
Attorney, Agent, or Firm—Cahill, Sutton & Thomas

[57] ABSTRACT

A modular plug-in instrumentation system for enabling a personal computer to perform instrumentation functions, including receiving analog and digital signals from an external device and transmitting analog and digital signals to an external device, includes a carrier module pluggable into a bus of the personal computer, and also includes an internal instrumentation bus into which a plurality of different interchangeable instrument modules can be plugged. The instrumentation bus includes a digital portion, and also includes a segmented analog portion that is extendable merely by plugging instrumentation modules into bus connectors which span gaps between the analog bus segments. Analog and/or digital signals are communicated between various instrument modules and external devices by means of cables connected to the instrument modules. The carrier module includes interface circuitry that buffers, reconfigures, and synchronizes digital data from the personal computer bus to be compatible with the digital portion of the instrumentation bus. One embodiment of the carrier module includes a microprocessor system and a dual port memory which allows simultaneous execution of different programs by the carrier module and the personal computer.

36 Claims, 12 Drawing Figures

PERSONAL COMPUTER INSTRUMENTATION SYSTEM INCLUDING CARRIER BOARD HAVING BUS-ORIENTED PLUG-IN INSTRUMENTATION MODULES

BACKGROUND OF THE INVENTION

The invention relates to apparatus and techniques for enabling computers, especially personal computers, to economically and flexibly perform various instrumention functions.

With the recent widespread use of personal computers for home use and business uses as well as engineering and scientific uses, efforts have been made and products have been developed to expand the possible uses of personal computers into various other control and instrumentation functions that typically have been performed by specialized machines. For example, one manufacturer makes a printed circuit board that can be plugged into an Apple computer to make it function as an oscilloscope. There are a variety of other such applications in which printed circuit boards are being manufactured to be plugged directly into vacant board slots that are provided in most personal computers.

Although this approach to expanding use of personal computers appears promising, there are a number of problems that up to now have prevented such "plug-in" printed circuit boards from being more widely used than they are. For example, one fairly large market for plug-in computer cards would be in the area of enabling small manufacturing concerns to accomplish automated process control and/or automatic testing by means of printed circuit board systems that could be plugged into inexpensive personal computers. The types of functions that need to be accomplished by means of such printed circuit boards include receiving (usually by means of cables) both digital signals and analog signals produced by equipment that controls and/or monitors manufacturing or testing functions. Another function that frequently needs to be performed by instrumentation includes transmitting of both digital signals and analog signals to equipment involved in the control of and monitoring of manufacturing or testing operations.

Due to the fact that there are a very large number of different manufacturers of personal computers presently on the market, there is no "standard" bus, into which all "instrumentation boards" for a particular function can be plugged. Therefore, instrumentation boards that are capable of performing a particular instrumentation function need to be specially designed for each different brand or type of personal computer. This adds substantially to the product development costs, manufacturing costs, and the servicing costs of a particular type of instrumentation board, if it is to be made available to users of many different makes of personal computers. Such increased costs, of course, limit the market. Another problem with this approach is that in order to use an instrumentation plug-in card to enable a personal computer to perform a particular instrumentation function, especially a complex instrumentation function, specialized software also needs to be provided. At the present state of the art, in order to accomplish the objective of providing instrumentation functions by "expanding" personal computers by plugging in specialized instrumentation boards, every different kind of instrumentation function must be implemented on a different printed circuit board, and this must be done for each different make of personal computer, and different corresponding software must be provided for each different type of instrumentation board and personal computer used.

Although a fairly high degree of "modularity" has been achieved for various digital functions and components (due to the widespread use of "bus-oriented" digital equipment structures), the entirely different nature of analog signals, up to now, has not been commonly thought to be susceptible to or suitable for "bus-oriented" structures for processing analog signals in electronic instrumentation systems.

In view of the foregoing circumstances, it is clear that there remains an unmet need for providing plug-in instrumentation modules for connection to a wide variety of computer bus structures while minimizing the complexity of, and the portion of the cost, that are attributable to differences between the bus structures and internal operations of various popular personal computer, so that economies of scale can be achieved, both in hardware and software.

SUMMARY OF THE INVENTION

Accordingly, it is an object of the invention to provide a modular instrumentation system that can be plugged into a host computer bus connector to allow the host computer to perform a variety of instrumentation functions.

It is another object of the invention to provide a modular instrumentation system that can use the same instrument modules to provide the same instrumentation capability for any of a wide variety of commercially available host computers having different bus structures, without the need to provide a redesigned version of such instrument modules that make them adaptable to each of the various bus structures in conjunction with which such instrument modules are to be used.

It is another object of the invention to provide an expandable family of instrumentation modules that merely need to be plugged into any of a wide variety of host computers to provide an instrumentation capability for that host computer.

It is another object of the invention to provide a modular instrumentation system that can be plugged into a variety of different host computers without the need for substantial hardware modification or substantial modification of the software needed to effectuate performance of the desired instrumentation function.

It is another object of the invention to provide a modular instrumentation system that can provide an instrumentation capability to a host computer while requiring a minimum amount of software to be executed by the host computer to effectuate performing the desired instrumentation function.

Briefly described and in accordance with one embodiment thereof, the invention provides a plug-in instrumentation system for enabling a host computer to perform any of a variety of instrumentation functions, including receiving analog and/or digital signals from external devices, and sending analog and/or digital signals to an external device, the instrumentation system including a carrier module pluggable into a bus connector of the host computer and having an internal instrumentation bus having a digital portion and a segmented analog portion, and a plurality of instrument module connectors electrically connected to the digital portion and the segmented analog portions of the instrumentation bus, the segmented analog portion of the bus including segments that can be "extended" by merely plugging an instrument module into one of the instrument module connectors so that an analog signal on one conductor of a particular analog bus segment is received by and operated upon by a plugged-in instrument module and is transmitted in modified form to a conductor of an adjacent segment of the analog portion of the instrumentation bus.

In one described embodiment of the invention, interface circuitry is provided on the carrier module for reconfiguring and/or reformatting and/or synchronizing digital data received from either the digital bus of the host computer or the digital portion of the instrumentation bus, and then outputting the reconfigured and/or reformatted digital data to the other of those two buses. A variety of instrument modules, each pluggable into any of the instrument module connectors, is provided for effectuating one or more instrumentation functions, including receiving one or more analog signals, either from the segments of the segmented analog portion of the instrumentation bus or from a cable connected to a connector of the instrument module and extending to an external piece of equipment that is being controlled and/or monitored by the host computer, performing an analog or digital operation on the received analog signal, and transmitting the resulting digital or modified analog signal to the digital portion of the instrumentation bus or another analog segment thereof.

Other instrumentation functions which various ones of the instrument modules are capable of performing include receiving digital information, either from the digital portion of the instrumentation bus or from an external device (that is being monitored and/or controlled by the host computer) by means of a cable directly connected between the external device and the instrument module, performing a digital and/or analog conversion operation on the digital information received, and transmitting the insulting digital and/or modified analog signal to the digital portion of the instrumentation bus or to the analog portion of the instrumentation bus, respectively.

In the described embodiment of the invention, the carrier module includes an address register and a comparator circuit for comparing the present contents of the address register to an address output by the host computer. The carrier module also contains an identification register that allows the host computer to determine certain characteristics of the carrier module. Each of the instrument modules also includes an identification register that allows the host computer or a microprocessor system contained in a particular embodiment of the carrier module to determine characteristics of that instrumentation module.

After the characteristics of the carrier module and all instrument modules thereon have been determined by the host processor as a result of reading all of the identification registers, the host computer displays a menu of characteristics which are selectable by an operator, and prompts the operator to select a desired combination of instrumentation features that are available from the carrier module and instrument modules thereon. After selection of the desired features or "menu set-up" by the operator, the host computer displays a menu of run sequence options for the selected menu set-up, and prompts the operator to select a desired run sequence.

The host processor then executes the selected run sequence.

DESCRIPTION OF THE PREFERRED EMBODIMENT

Figure 1:
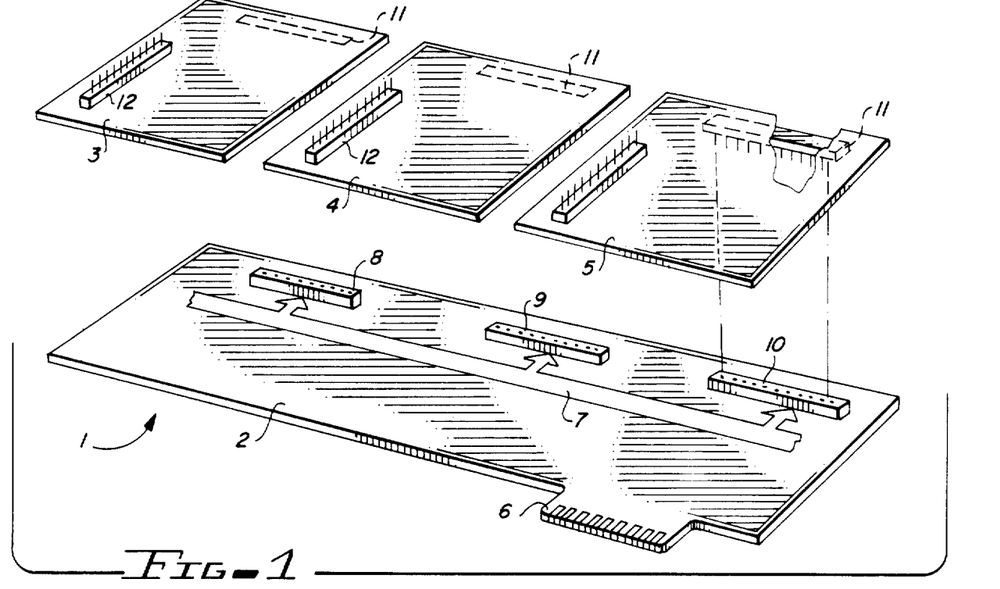
FIG. 1 is a perspective exploded diagram of the structure of a plug-in instrumentation system of the present invention.
Figure 1A:
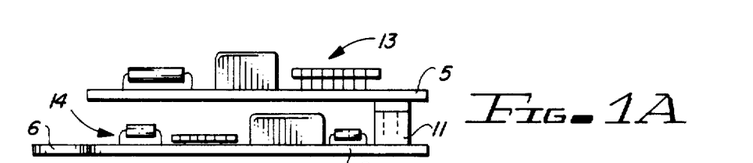
FIG. 1A is an end view diagram of the instrumentation system shown in FIG. 1.

Referring first to FIGS. 1 and 1A, reference numeral 1 designates the instrumentation system of the present invention. Plug-in instrumentation system 1 includes a plug-in carrier board 2 having an edge connector 6 by means of which carrier board 2 can be plugged into the bus connector of a host computer or personal computer. Carrier board 2 also includes three instrumentation bus connectors 8, 9 and 10 into which instrumentation modules 3, 4, and 5 can be plugged. Each of the instrumentation bus connectors 8, 9 and 10 is identical in the described embodiment of the invention, and each has its corresponding terminals connected, respectively, to corresponding conductors of an "instrumentation bus" designated by reference numeral 7.

Each of the instrumentation modules 3, 4, and 5 has mounted on the rear edge of its lower surface a male multi-pin connector, such as the one designated by reference numeral 11, by means of which that instrument module can be plugged directly into one of the instrumentation bus connectors 8, 9 or 10, the latter connectors being female connectors.

Typically, each of the instrument modules 3, 4 and 5 includes one or more male cable connectors, such as 12, by means of which an external ribbon cable or the like can be connected to an instrument that is being controlled or monitored by the host computer and/or the instrumentation system 1.

As best seen in FIG. 1A, the instrumentation modules such as 5 are rigidly supported a distance above the carrier module board 2 by means of the instrumentation bus connectors such as 11. If necessary for structural rigidity, the left end of the instrument board 5 can be further supported by means of a stand-off (not shown). The height of instrumentation bus connector 11 and any stand-offs is such that the electronic components 14 with which the carrier board 2 is loaded are adequately cleared by the bottom of instrument module 5, the latter also being loaded with various electronic components generally designated by reference numeral 13.

Figure 2:
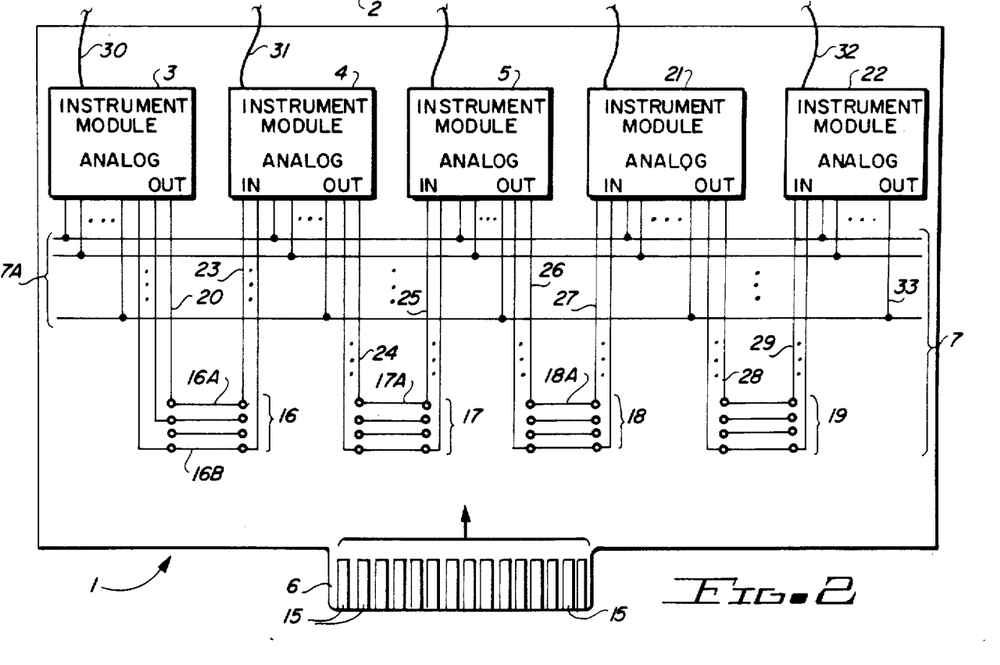
FIG. 2 is a block diagram useful in explaining the segmented analog bus structure of the carrier module of the instrumentation system of FIG. 1.

The structure of the instrumentation bus 7 can be better seen with reference to FIG. 2. In FIG. 2, reference numeral 15 designates individual conductors on the edge connector 6, which make contact to the individual conductors of the digital bus of the host computer, which typically might be an IBM personal computer. The host computer bus 15 includes address bus conductors, data bus conductors, power supply conductors, and a variety of control conductors.

Instrumentation bus 7 includes a "digital" bus portion generally designated by reference numeral 7A and a plurality of "analog" bus segments, generally designated by reference numerals 16, 17, 18, and 19 in FIG. 2. Typically, the digital bus portion 7A of instrumentation bus 7 may include 16 data bus conductors which can correspond precisely to 16 data bus conductors included in the host computer bus. The digital bus portion 7A of instrumentation bus 7 also includes a plurality of address bus conductors, and further includes a variety of power conductors and control conductors. Table 1 below indicates the various conductors of instrumentation bus 7 in the described embodiment of the invention, although other configurations of the digital portion 7A of instrumentation bus 7 are certainly possible.

TABLE 1

| Type | Name | Comments |
|---|---|---|
| B (Bidirectional) | D0-D15 | Data Lines, must be buffered on the instrument module. |
| I (Input) | ME* | Module enable, tied to the negative-logic enable lines on the instrument module data buffer, memory and other integrated circuits requiring an enable signal. |
| O (Output) | MPR* | Module present, tied to digital ground on the instrument module. |
| I | IOS* | I/O bank select, tied to the negative-logic chip select line on all instrument I/O devices. |
| I | MS0* | Memory bank #0 select, tied to the negative-logic chip select line on a primary memory bank. |
| I | MS1* | Memory bank #1 select, tied to the negative-logic chip select line on a secondary memory bank. |
| I | A0-A15 | Address Lines; do not require buffering on the instrument modules. |
| I | RD* | Read |
| I | WRT* | Write |
| I | RST* | Reset |
| I | CLK | Clock, non-stretched system "E" clock. |
| O | DMAR | Direct Memory Access Request |
| I | DMAA* | Direct Memory Access Acknowledge |
| I | DMAT | Direct Memory Access Terminate |
| O | IRQ0* | Interrupt request 0, wired-OR |
| O | IRQ1* | Interrupt request 1, wired-OR |
| I | SYNCIN | Synchronization Input, used for synchronizing instrument operation. |
| I | SYNCOUT | Synchronization Output, used for synchronizing instrument operation. |
| I | I0a, I0b | Analog input pair 0 |
| I | I1a, I1b | Analog input pair 1 |
| O | O0a, O0b | Analog output pair 0 |
| O | O1a, O1b | Analog output pair 1 |

TABLE 1-continued

| Type | Name | Comments |
|---|---|---|
| I | +5 V | Five volts, digital power (two lines) |
| I | DGND | Digital Ground (two lines) |
| I | +15 V | Plus fifteen volts, analog power |
| I | −15 V | Minus fifteen volts, analog power |
| I | AGND | Analog Ground, not connected to DGND on the Instrument Module. |
| | RSVD | Reserved |

Note that * designates the logical complement of a variable.

In FIG. 2, each of the analog bus segments, such as 16, 17, etc. includes four analog conductors, such as 16A, 16B, 17A, etc.

At this point, it is important to note that each of the instrument modules 3, 4, 5, etc. has at least one analog terminal, and most of the instrument modules have two analog terminals, including an analog input terminal and an analog output terminal. Reference numerals 20, 24, 6, 28, and 33 designate analog output terminals of instrument modules 3, 4, 5, 21 and 22, respectively. Similarly, reference numerals 23, 25, 27 and 29 designate analog input terminals of instrument modules 4, 5, 21, and 22, respectively. In FIG. 2, the analog input terminals and the analog output terminals are conductive male prongs that extend out of the instrumentation bus connectors, such as 11 (FIG. 1) and into corresponding receptacles of the female instrumentation bus connectors, such as 8, 9 and 10.

Thus, it can be seen that each analog bus conductor, such as 16A, 17A, 18A, etc. is connected to a respective analog terminal, i.e., either an analog output or an analog input, of least two different instrument modules.

It is to be understood that the instrument module 3 has four analog output terminals, such as 20, each connected to a separate respective one of the individual conductors of analog bus segment 16, and similarly, instrument module 4 has four analog input terminals, such as 23, each connected to a different respective one of the conductors, such as 16A of analog bus segment 16. (Note that for clarity of illustration, not all of the analog terminals of all of the instrument modules are shown).

Each of the instrument modules 3, 4, 5, etc. may be capable of performing a different analog function on signals being conducted on various ones of the analog bus segment conductors, and then outputting that analog signal on one of its analog output terminals and conducting it to a corresponding analog bus conductor of the next segment. Thus, it can be said that each of the analog bus segments, such as 16, 17, etc. is "extendable" to the next analog bus segment. In most instances, the analog signals are physically "coupled through" an instrument module to adjacent analog bus segments by plugging in an instrument module that is connected to both bus segments. However, in some instances, there may be no such internal coupling, in which case one analog bus segment, or at least a conductor thereof, may be electricaly isolated from the adjacent analog bus segment, even though an instrument module is plugged in that is physically connected to both. In some instances, there may be a short circuit between a particular analog input terminal such as 23, and an analog output terminal, such as 24 of the same instrument module.

In FIG. 2, reference numerals 30, 31, and 32 designate external cables which can be connected to cable connectors, such as cable connector 12 of instrument module 3 in FIG. 1, in order to conduct both analog and digital information to and/or from a external device being controlled and/or monitored by a particular instrument module.

Figure 3:
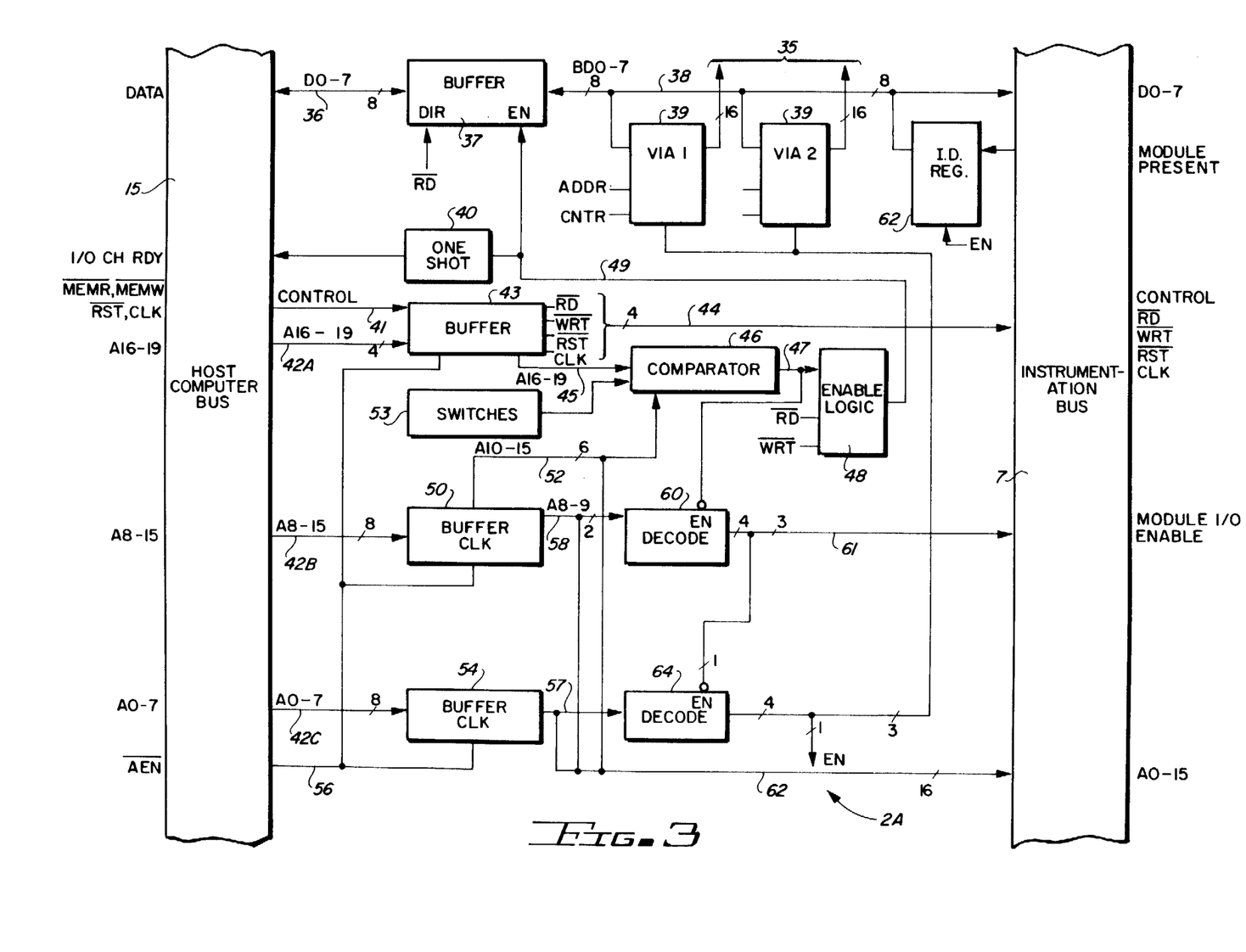
FIG. 3 is a block diagram of the circuitry of a basic carrier module, in accordance with the present invention.

Referring now to FIG. 3, it is to be understood that carrier module 2 has various kinds of circuitry on it coupling the host computer bus conductors 15 (FIG. 2) to the instrumentation bus 7. In one embodiment of the present invention, a "basic" carrier board circuit, designated by reference numeral 2A, as shown in FIG. 3, is provided which performs the various basic buffering, timing, and clocking functions necessary to transfer the digital information on the host computer bus 15 to the digital portion 7A (FIG. 2)of the instrumentation bus. Carrier card or carrier board circuit 2A also performs the functions of translating power supply voltages, if this is necessary for operation of circuitry on the various instrument modules. In one embodiment of the invention, designated by reference numeral 2B in FIG. 4, the carrier module circuitry is "smart" in that it includes a microprocessor system and a memory that executes programs and thereby greatly reduces the software burden on the host processor. The basic carrier module circuitry will be described first, with reference to FIG. 3.

Referring again to FIG. 3, "basic" carrier card circuit 2A includes seven data conductors 36, namely conductors D0-D7, connected to a bi-directional data buffer circuit 37 which can be implemented by means of a 74LS245 integrated circuit. The resulting buffered data output signals BD0-BD7 are produced on eight conductors designated by reference numeral 38, which are connected to corresponding terminals of the instrumentation bus 7.

If desired, the buffered data bus conductors 38 are coupled to the data terminals of versatile interface adaptor circuits 39, which interface between buffered data bus 38 and an external conductor cable 35.

Buffered data bus conductors 38 are also connected to the data terminals of an identification register 62, which can be implemented by means of a 74LS244 integrated circuit register and some suitable jumpers that tie the inputs of the 74LS244 to appropriate "zero" or "one" levels to identify the type of circuit that carrier board circuit 2A is to the host processor into which carrier board 2A is plugged.

The "direction" or DIR input of bi-directional buffer circuit 37 is connected to the RD* conductor of instrumentation bus 7. (Note that asterisks represent logically complemented logic signals.) The enable input of bi-directional buffer 37 is connected to the input of a one shot circuit 40 and to conductor 49. The purpose of one shot 40 is to briefly suspend the operation of the host computer, if necessary, to allow slower circuitry in instrumentation system 1 to "catch up" by "stretching" the 1/0 CH RDY (i.e., input-output channel ready) or "wait" signal.

A plurality of control inputs of the host processor digital bus, including conductors 41 in FIG. 3, including the memory write signal MEMR*, MEMW*, RST* and CLK are connected to the inputs of a buffer circuit 43, which can be implemented by means of a 74LS244 integrated circuit.

Address conductors A16-A19 of the host processor bus 15 are designated by reference numeral 42A, and are also connected to inputs of buffer circuit 43. Similarly, address inputs A0-A15 of host processor bus 15 are designated by reference numeral 42B, and are connected to the inputs of buffer circuit 50, and address inputs A0-A7, designated by reference numeral 42C of host processor bus 15 are connected to the inputs of buffer circuit 54. The clock inputs of buffers 43, 50 and 54 are connected to conductor 56, which is connected to the AEN* (address enable) conductor of host processor bus 15.

The outputs of buffer 43 include four buffer control signals designated by reference numeral 44 and four buffered address signals designated by reference numeral 45. The signals 44 are connected directly to the corresponding conductors of instrumentation bus 7. The buffered address conductors 45, namely A16-A19, are connected to respective inputs of comparator circuitry 46. Buffered address output conductors A1-0-A15, designated by reference numeral 52, are also connected to respective inputs of comparator circuit 46. The nine buffered address inputs connected to inputs of comparator circuit 46 are compared with the settings of nine corresponding switches 53, which define the address of carrier card circuit 2A. If the matching address is supplied by the host computer via host computer bus 15, an output signal on conductor 47 will be applied to the input of enable logic circuit 48, the output of which is produced on conductor 49. The RD* and WRT* inputs produced by buffer circuit 43 are also applied to enable logic circuitry 48. The RD* and WRT* signals are applied to enable logic to prevent false read or write operations during state transition times. The A8 and A9 outputs of buffer 50 are connected to the decode inputs of decode circuit 60.

Comparator circuit 46 can be easily implemented by means of ten exclusive OR circuits, the outputs of which are logically ORed to produce the select signal on conductor 47 that enables decode logic 60 and enable logic 48. Enable logic 48 can be implemented by means of a 74LS13a integrated circuit. Decode circuit 60 can be implemented by means of a 74ALS520 and a 74LS85 integrated circuit. It performs the function of producing four decoded output signals, generally designated by reference numeral 61, three of which are connected to the Module I/O Enable conductors of instrumentation bus 7. These conductors perform the functions of selecting the various functions, such as memory or I/O, of the instrument modes. The other output of decode circuit 60 is connected to the enable input of decode circuit 64.

Two of the buffered address outputs produced on conductors 57 by buffer circuit 54 are applied to the decode inputs of decoder circuit 64. The other six outputs of buffer circuit 54 are coupled, along with the buffered address output signals A10-A15 and A6-A9, to buffered address bus 62, which is connected to the corresponding A0-A15 address conductors of instrumentation bus 7. Buffers 50 and 54 can be 74LS244s.

In operation, Buffers 50 and 54 are used for insulating host computer's address lines from the instrumentation bus. Decoders 60 and 64 further define the specific instrumentation to isolate the host computer data bus 15 from the instrumentation bus data bus conductors D0-D7. One shot circuit 40 is used to temporarily suspend the operation of the host computer, by "stretching" the Wait control signal thereto and thereby synchronizing operation of the host computer bus 15 with the instrumentation bus 7. The reason that this is necessary, is that some of the elements plugged into the instrumentation bus require a longer period of time for proper operation than the host computer bus and therefore the host computer bus must be suspended until the slower elements can finish their process. Buffer 43 isolates various control signals from the host computer bus to the instrumentation bus including the read*, write*, reset*, and CLK signals. Comparator 46 connected, through line 47 to the enable logic 48, is used to control the direction of the data bus buffer 37. Interface adaptors 39 are digital input-output ports that are "accessory" circuits for carrier module 2A; they are not required for its operation and are included to provide extra features for the user. Identification register 62 provides identification of various characteristics of this carries module so that the host computer can determine which carrier module is plugged into it and whether any instrument modules are plugged into the instrumentation bus 7.

Before describing the "smart" carrier circuitry 2B of FIG. 4, which contains a microprocessor system, several exemplary embodiments of the instrument modules of FIGS. 1 and 2 will be described in detail.

Figure 5:
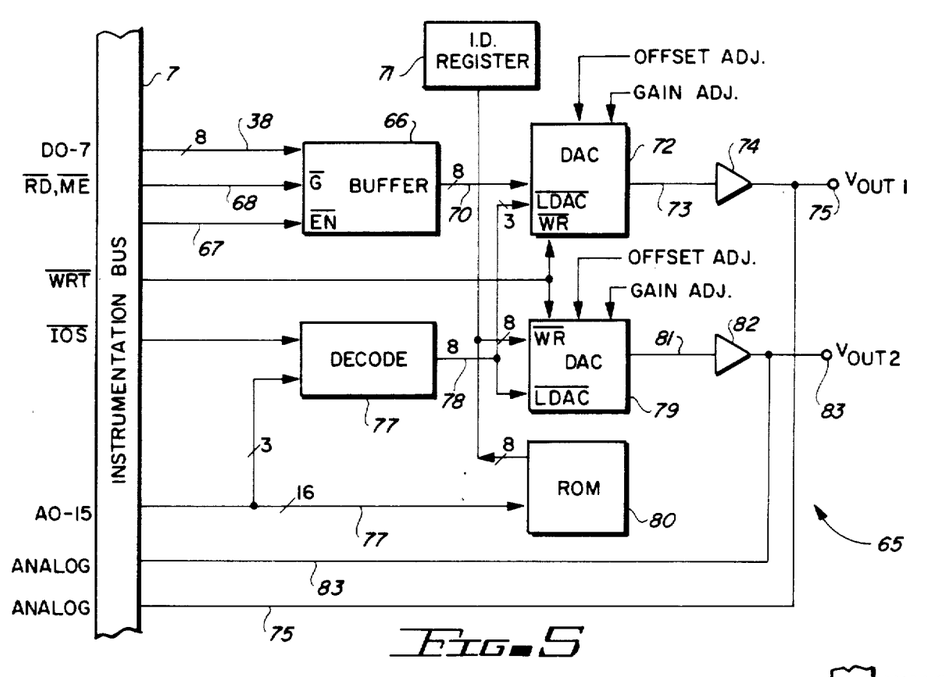
FIG. 5 is a block diagram of an analog output or function generator instrument module that can be plugged into the carrier module of FIG. 1.

Referring next to FIG. 5, reference numeral 65 designates an instrument module that is referred to as an "analog out" or "function generator" module. Analog out instrument module circuit 65 includes a bi-directional buffer circuit 66, which can be a 74LS245 integrated circuit, having one set of its input/output terminals connected, respectively, to the D0–D7 conductors of (module enable) instrument bus 7 and also to the RD* (read) and ME* conductors of instrumentation bus 7. Three of the address signals A0–A15, namely A0–A2, of instrumentation bus 7 are applied to the decode inputs of a decode circuit 77, which can be a 74LS138 one of eight integrated circuit decoders. Four of the resulting decoded outputs 78 are connected to the LDAC* (load DAC) input, the NA*, the NB* and the NC* (nibble A, nibble B, nibble C) inputs of digital to analog converter 72, which can be a Burr-Brown DAC811 twelve bit digital to analog converter circuit. Another four of the outputs of decode circuti 77 are connected to the correspoding LDAC*, NA*, NB*, AND NC* inputs of digital to analog converter 79, which can also be a Burr-Brown DAC811. The functions of the foregoing inputs will be readily apparent to one skilled in the art upon review of the specification sheet for the Burr-Brown DAC811.

The WR* inputs of digital to analog converters 72 and 79 are connected to the WRT* conductor of instrumentation bus 7. The output of digital to analog converter 72 is coupled by conductor 73 to a suitable buffer or driver circuit 74, the output, out of which is connected to an analog output conductor 75. Various voltage or current driver circuits that satisfy particular needs can be provided by those skilled in the art to implement driver or buffer circuit 74. Similarly, the output of digital to analog converter 79 is coupled by conductor 81 to another suitable output buffer or driver circuit 82. Buffer circuit 82 produces an analog output voltage $V_{OUT2}$ on conductor 83. Both conductors 75 and 83 are connected to two of the analog bus segment conductors such as 16A and 16B in FIG. 2.

The "analog output" module 65 of FIG. 5 can be converted into a computer controlled function generator by storing a suitable list of desired analog output voltage values of $V_{OUT1}$ and $V_{OUT2}$ that are desired in order to create particular desired time-varying analog output voltages or pairs of analog output voltages. Read only memory 80 can be implemented by any suitable commercially available read only memory. Its address inputs are connected to the desired ones of the address signals A0-A8 on instrumentation bus 7 and the data terminals of read only memory 80 are connected to the bi-directional data conductors 70, which can output by bi-directional buffer 66 onto the bi-directional data conductors 38 of instrumentation bus 7.

The host computer then, at times determined by the stored program being executed by the host computer, can determine digital equivalents of the desired analog values by appropriately addressing read only memory 80 via address signals A0–A15, fetching the digital equivalents of the analog signal at each time via data bus conductors 70, outputting those digital values to one or both of digital to analog converters 72 and/or 79, thereby causing the appropriate time-varying analog output function or functions to be produced on conductors 75 and/or 83.

Figure 6:
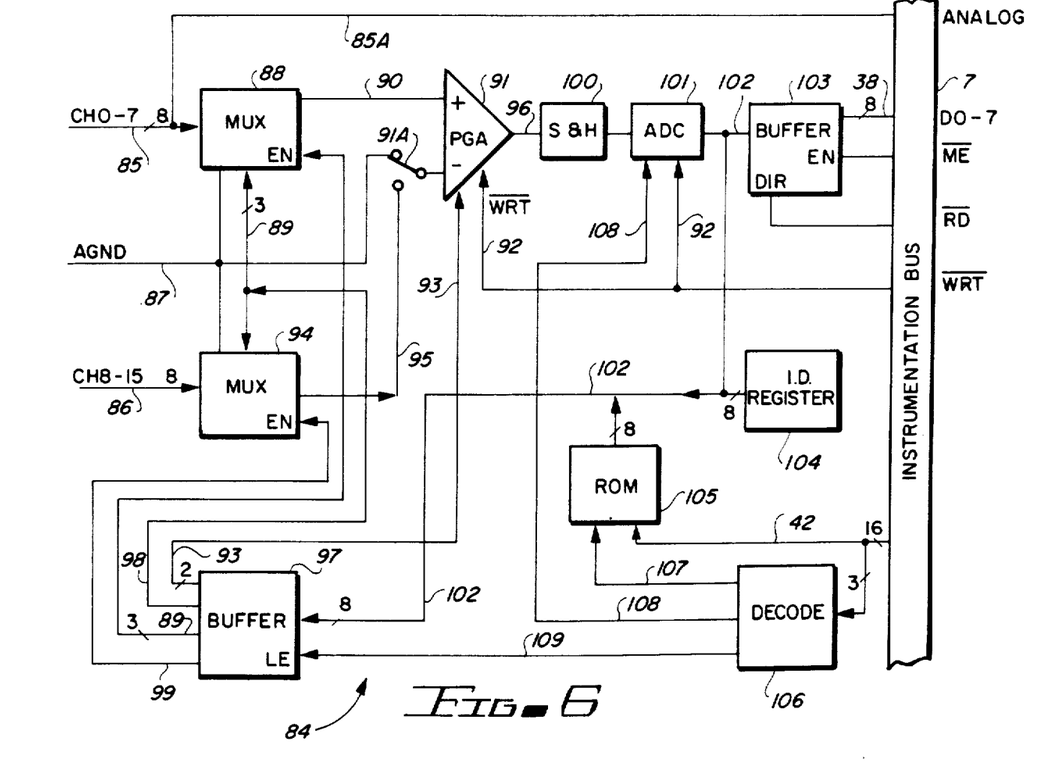
FIG. 6 is a block diagram of an analog input or data acquisition instrument module that can be plugged into the carrier module of FIG. 1.

Referring next to FIG. 6, an "analog in" or "data acquisition system" instrument module 84 is described as another possible embodiment of an instrument module that can be plugged into the carrier module 2A of FIG. 3. In FIG. 6, reference numeral 85 collectively designates eight analog input conductors or "channels" having analog signals CHO–CH7 thereon. Similarly, reference numeral 86 designates eight additional analog channel signals CH8-CH15. The analog channel 85 has its respective conductors coupled to corresponding inputs of a multiplexer 88, which can be an MPC8S integrated circuit manufactured by Burr Brown Corporation. Similarly, the analog channel signals CH8–CH15 are connected to corresponding inputs of multiplexer 94, which can also be an MPC8S integrated circuit. Two of the analog signals 85 are also routed, as indicated by reference numeral 85A, to instrumentation bus 7, to facilitate "extension" of two conductors of the particular analog bus segment corresponding to the socket into which data acquisition instrument module 84 is plugged, as previously explained.

In FIG. 6, reference numeral 87 designates an analog ground (AGND) conductor, which is connected to the appropriate ground conductor of multiplexers 88 and 94. The particular one of the eight channels of each of multiplexers 88 and 94 is selected by the combination of digital levels on three select conductors 89 produced by a buffer circuit 97. The particular one or two of multiplexers 88 and 94 that are selected is controlled by signals produced on conductors 89 and 98 by buffer circuit 97, which can be a 74LS373 integrated circuit. The states of the bits of buffer 97 are set by the eight signals that are produced on conductors 102 from the data bus bits D0–D7 of instrumentation bus 38.

The output of multiplexer 88 is conducted by conductor 90 to the positive input of a programmable gain amplifier 91, which can be a 200/201 AG programmable gain amplifier manufactured by Burr Brown Corporation. The negative input of programmable gain amplifier 91 is connected by means of a switch 91A to connect it to either an analog ground voltage level on conductor 87 or to the output of multiplexer 94, which is produced on conductor 95. Thus, programmable gain amplifier 91 can receive and amplify the analog signals on the CH0–CH7 conductors being input to multiplexer 88, with reference to ground i.e., in a "single ended" fashion, or differentially, i.e., with reference to corresponding respective ones of the CH8–CH15 conductors that are being input to multiplexer 94, depending on the setting of switch 91A.

Conductors 93 are connected to the A0 and A1 inputs of programmable gain amplifier 91, and are also connected to outputs of buffer 97 in order to perform the function of gain selection.

Conductor 92, which is connected to the WRT* conductor of instrumentation bus 7, is connected to the WR* input of programmable gain amplifier 91, to perform the function of latching the selected gain into the internal circuitry of the programmable gain amplifier 91.

The output of programmable gain amplifier 91 is produced on conductor 96 and is input to sample and hold circuit 100, which can be an LF398A integrated circuit manufactured by National Semiconductor. This circuit can be connected as a short circuit if "sample and hold" operation is not desired. The output of sample and hold circuit 100 is connected to the analog input of an analog to digital converter 101, which can be an AD574 twelve bit analog to digital converter manufactured by Analog Devices, Inc. Its twelve digital outputs are multiplexed onto the eight conductors 102. The outputs of analog to digital converter 101 are connected to the upper order tour inputs of buffer 103, which can be a 74LS245 bi-directional integrated circuit buffer.

Eight conductors of buffered data bus 102 are applied to the inputs of buffer 97. The enable input of buffer 97 is connected by conductor 109 to an output of decoder 106, which can be a 74LS138 integrated circuit. The eight conductors of buffered data bus 102 are also connected to identification register 104, which can be a 74LS244 latch having its inputs strapped to produce the desired identification code that identifies the characteristics of analog input instrument module 84.

The "direction" input DIR of bi-directional buffer 103 is connected to the RD* (read) conductor of instrumentation bus 7. The enable input of bi-directional buffer 103 is connected to the ME* (module enable) conductor of instrumentation bus 7.

The twelve output bits of analog to digital converter 101 are multiplexed onto the eight conductors of buffered data bus 102, the lower order four bits being first multiplexed onto the upper "nibble" or four bits of buffered data bus 8, and the two upper nibbles of the output of analog to digital converter 101 subsequently being multiplexed onto all eight conductors of buffered data bus 102.

Figure 4:
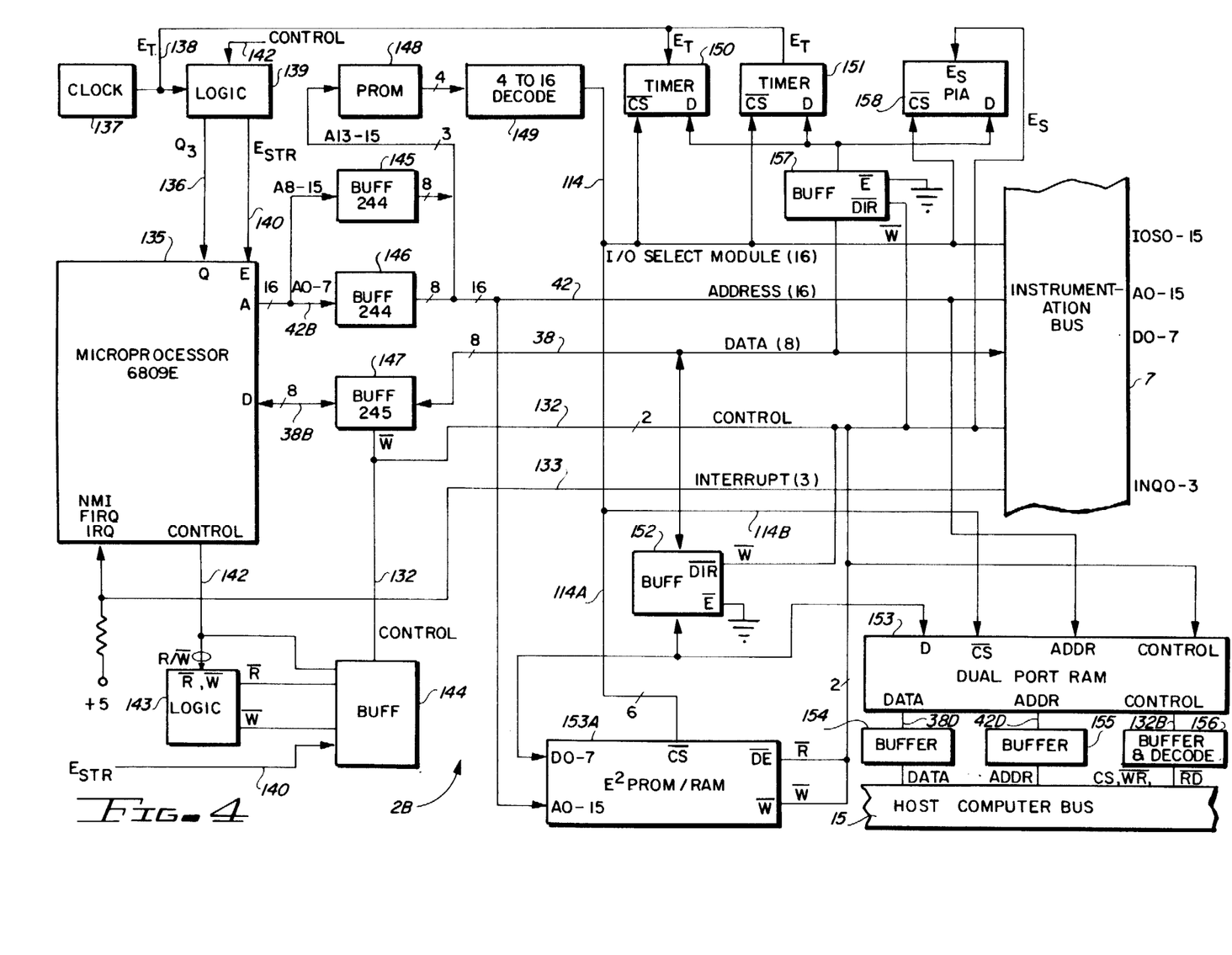
FIG. 4 is a block diagram of circuitry of a "smart" carrier module, having an onboard microprocessor and RAM, that can be used on the carrier module of FIG. 1.

By suitably programming the gain of programmable gain amplifier 91, analog to digital converter 101 and other elements of circuit 84, by means of the host computer or a "smart" programmed carrier module such as 2B of FIG. 4, the analog input or data acquisition module 84 of FIG. 6 can be made to function as a voltmeter or a waveform recorder.

The program necessary to be executed by the host computer or by the smart carrier module circuit can be stored in read only memory 105 and addressed by means of the address bus conductors A0-A15 of instrumentation bus 7 and read by the host computer or smart carrier module circuit (of FIG. 4) via buffered data bus 102, buffer 103 and the D0-D7 conductors of instrumentation bus 7.

Figure 7:
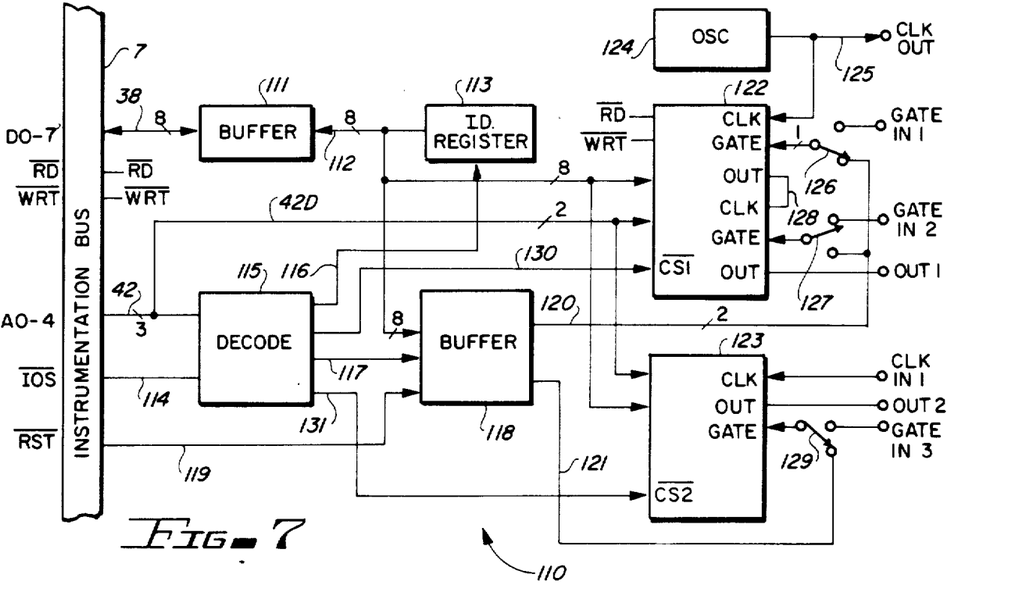
FIG. 7 is a block diagram of a counter-timer-pulse generator instrument module that can be plugged into the carrier module of FIG. 1.

Referring next to FIG. 7, reference numeral 110 indicates another instrument module, referred to as a counter-timer-pulser instrument module. Counter-timer-pulser instrument module 110 includes a bi-directional buffer circuit 111, which can be a 74LS245 integrated circuit, having one set of data terminals coupled by eight conductors 38 to the D0-D7 data conductors of instrumentation bus 7. Buffer 111 has its other set of data terminals connected to eight corresponding buffered data terminals 112. An identification register 113, which can be a 74LS244 with appropriately strapped inputs to produce an identification code that can be read by the host computer, is connected to the buffered data conductors 112. The buffered data conductors 112 are also connected to eight corresponding inputs of a programmable timer counter circuit 122, which can be a 8254 integrated circuit manufactured by Intel, Inc. The eight buffered data conductors 112 are also connected to the eight data inputs of another identical programmable counter timer integrated circuit 123, which can also be implemented by means of an Intel 8254 integrated circuit.

Before describing the operation of the programmable timer counters 122 and 123, it is helpful to first describe the structure of the decoding circuitry 115, which can be implemented by means of a 74LS138 integrated circuit. It has three decode inputs connected to the A0-A3 address conductors of instrumentation bus 7, collectively designated by reference numeral 42. The A3 and A4 address conductors, designated by reference numeral 42D are applied to the function select inputs of both programmable counter timers 122 and 123. An IOS* (input-output select) conductor of instrumentation bus 7, which performs the function of selecting decode circuit 115, is connected to the enable input of decode circuit 115.

One of the decode outputs of decoder circuit 115 is coupled by conductor 116 to the enable input of identification register 113. Another output of decode circuit 115 is conducted by conductor 130 to the CS1* input of programmable counter timer 122. Another output of decode circuit 115 is connected by conductor 131 to the CS2* input of programmable counter timer 123.

The RD* and WRT* conductors of instrumentation bus 7 are connected to corresponding read and write inputs of both programmable counter timers 122 and 123. A free running oscillator circuit 124 (which can be easily implemented by those skilled in the art) has its output, preferably at eight megahertz, produced on conductor 125, on which a CLKOUT signal is produced, connected by an appropriate cable or the like to equipment to which counter-timer instrument module 110 is coupled.

The 8254 is a programmable interval timer/counter integrated circuit designed for use with Intel and other micro-computer systems. It is a general purpose, multi-timing element that can be treated as an array of input-output ports by the system software. The 8254 solves one of the most common problems in any microcomputer system, that is, the generation of adequate time delays under software control (instead of setting up timing loops in the software). The programmer "configures" or programs the 8254 to match his requirements, and programs one of the counters for the desired delay. Software overhead is minimal. Variable length delays can easily be programmed. Some of the other counter-timer functions which can be implemented with the 8254 include reat time clock generation, an event counter, a digital one-shot, a programmable rate generator, a square wave generator, a binary rate multiplier, a complex waveform generator, and a complex motor controller.

Clock out conductor 125 is connected to the first CLK input of programmable timer circuit 122. A first GATE input of programmable timer counter 122 can be switched to either an external gating signal GATE IN1 produced by the external equipment to which counter timer instrument module 110 is connected or to an internally gated signal produced on conductor 120 by buffer circuit 118. The selected connection is made by means of a switch or jumper 126.

A first output produced by counter-timer circuit 122 is connected back to a second CLK input thereof by means of conductor 128 to produce a gated, divided down internal signal in counter-timer circuit 122. That circuit is gated by a second GATE signal which is coupled by means of switch or jumper 127 to an externally generated signal GATE IN2 or by internally generated GATE signal on one of the two conductors 120 produced by buffer 118. Buffer 118 can be a 74LS273. Similarly, the second counter-timer circuit 123 can be externally clocked by a signal CLK IN1 which is gated either internally by means of a signal produced by buffer 118 on conductor 121 or an externally generated gate signal GATE IN3, whichever is selected by switch 129.

It should be appreciated that the Intel 8254 programmable counter timers have more internal capability of programmably measuring and/or producing signals than is indicated by the simplified connections shown in FIG. 7. The reader is referred to the appropriate Intel data sheets and the 8254 operating manual for additional possibilities in controlling the counting/timing/pulse generating capability of these circuits.

Referring now to FIG. 4, the structure of "smart" carrier module circuit 2B is described. This carrier module circuit includes a microprocessor 135, which can be a Motorola MC6809E eight bit microprocessor. Microprocessor 135 has a 16 bit address bus designated by reference numeral 42B and having its A0–A7 conductors connected to inputs of buffer circuit 146, which can be a 74LS244 integrated circuit, and having its A8–A15 conductors connected to the inputs of buffer circuit 145, which also can be an 74LS244 integrated circuit. The outputs of buffer circuits 145 and 146 constitute a buffered address bus 42, which is connected to the A0–A15 conductors of instrumentation bus 7.

Microprocessor 135 has eight bi-directional data bus conductors 38B which are connected to the inputs of a bi-directional buffer 147, which is implemented by means of a 74LS245 integrated circuit. The buffered bi-directional data bus conductors are designated by reference numeral 38, and are connected to the D0–D7 data bus conductors of instrumentation bus 7.

The buffered address bus conductors 42 are connected to the address inputs of a random access memory 153, and the A13–A15 conductors of buffered address bus 42 are connected to the address inputs of a programmable read only memory 148, the four data conductors of which are connected to a four of sixteen decoder, circuit 149, which can be a 54LS154 integrated circuit decoder producing 16 chip select outputs on bus 114. One of these chip select signals goes to a timer circuit 150 and another goes to a second timer circuit 151. Also, 16 of the chip select outputs 114 are connected to IOS0–IOS15 conductors of instrumentation bus 7. Timers 150 and 151 can be 6840 integrated circuits manufactured by Motorola. They produce a "stretched" clock signal $E_{STR}$ on conductor 138, which has the effect of "stretching" the clock signal produced by clock circuit 137 when certain devices peripheral to microprocessor 135 are addressed by it.

The buffered data bus 38 is connected to the inputs of a bi-directional buffer circuit 152 which can be a 74LS245 integrated circuit. The DIR* input of bi-directional buffer circuit 152 is connected to the WRITE* conductor of control bus 132, which is connected to the control conductors of instrumentation bus 7. The control bus 2 includes the WRT* and RD* conductors of instrumentation bus 7, and are produced by buffer circuit 144 which can be a 74LS244 integrated circuit, with the control signals produced on control bus 142 by microprocessor 135 and decoded by read-write logic circuitry 143, which can be implemented by means of several NAND gates and an inverter.

The $E_{STR}$ signal on conductor 140 is also loaded into buffer 144.

The buffered data bus conductors 38 are connected to the D0–D7 conductors of instrumentation bus 7, and also connected to load buffer 157, which can be a 74LS245, the output of which loads timer circuits 150 and 151 and also loads peripheral interface adaptor circuit 158. The function of peripheral interface adaptor 158, which can be a Motorola 6822 peripheral interface adaptor, is to control digital input/output signals on control bus 132. The signals on control bus 132 are connected directly to the RD*, WRT*, and several conductors of instrumentation bus 7.

The second' set of data terminals of bi-directional buffer circuit 152 is connected to eight-bit buffered data bus 38C, which is connected to the data terminals of random access memory RAM/E²PROM 153A and is also connected to the bi-directional data terminals of dual port random access memory 153. The latter circuit can be a Synertek SY2130/2131 integrated circuit. The chip select inputs of dual port RAM 153 are connected to conductors 114B of chip select bus 114. The chip select inputs of random access memory 153 are connected to conductors 114A of chip select bus 114. The address inputs of buffered address bus 42 are connected to the 16 address inputs of dual port RAM 153.

Access by the host computer, via host computer bus 115 to dual port RAM 53, is effectuated by means of bi-directional buffer circuit 154, which can be a 74LS145 integrated circuit, the other terminals 38D of which are connected to the second set of bi-directional data terminals of dual port RAM 153.

The 16 address bus conductors of the host computer bus 15 are coupled to inputs of address buffer 155, which can be comprised of 74LS245 integrated circuits, the outputs of which are connected to the 16 address conductors 42D, which are also connected to the address inputs of dual port RAM 153.

The second set of control ports 132B of dual port RAM 153 are driven by buffer and decode circuit 156, the inputs of which are connected to the conductors of the host computer bus 15. The outputs of buffer and decode circuit 156 include the CS*, WR* and RD* inputs of the second set of ports of dual port RAM 153. Buffer and decode circuit 156 can be implemented with a 74LS244 integrated circuit and a 74LS138.

At this point it should be appreciated that the above described carrier module circuitry and instrument module circuitry is utilized in conjunction with programs or subroutines that are executed by the host computer or by the microprocessor 135 of the smart carrier module 2B of FIG. 4 in order to run selected instrumentation functions for a particular purpose in a particular environment.

Figures 8, 9:
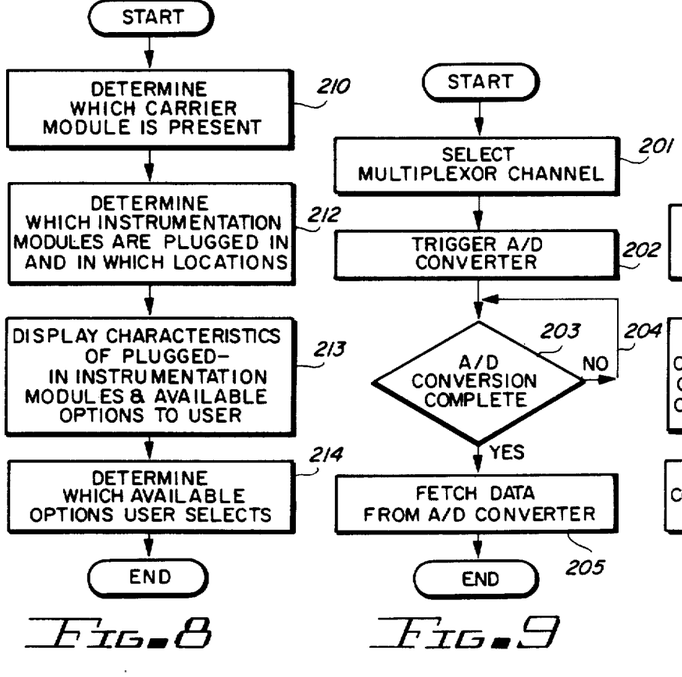
FIGS. 8-11 are flow charts of programs that can be executed by a host processor to effectuate operation of the instrumentation system of FIG. 1.

Fig. 8 is a somewhat generalized flow chart of a routine by means of which the host processor, (which may be an IBM personal computer into which the carrier module is plugged) can identify the configuration of the carrier module 2A of FIG. 3 and all of the instrument modules such as 3, 4 and 5 of FIG. 1 that are plugged into the carrier module 2A. The routine of FIG. 8 begins by entering block 210 and determines which carrier module is present by reading the identification register 62 (FIG. 3) of the carrier module 2A. Then, the routine goes to block 212 and determines which instrumentation modules are plugged into the carrier modules and at what address locations, by reading the identification registers of those instrumentation modules and possibly by reading other information stored in read only memories of the various instrumentation modules.

Next, the configuration identifying routine of FIG. 8 goes to block 213 and executes a subroutine that causes display of the characteristics of the entire instrumentation system of FIG. 1, including the carrier module 2 and the instrument modules 3, 4 and 5, and also displays all of the available options of that hardware that are available to the present user.

Then, the routine of Fig 8 enters block 214 and determines which available option the user selects. This is actually done by executing the routine of FIG. 11, subsequently described. A computer listing of a program represented by the flow chart of FIG. 8 is attached hereto as Appendix A.

Figure 11:
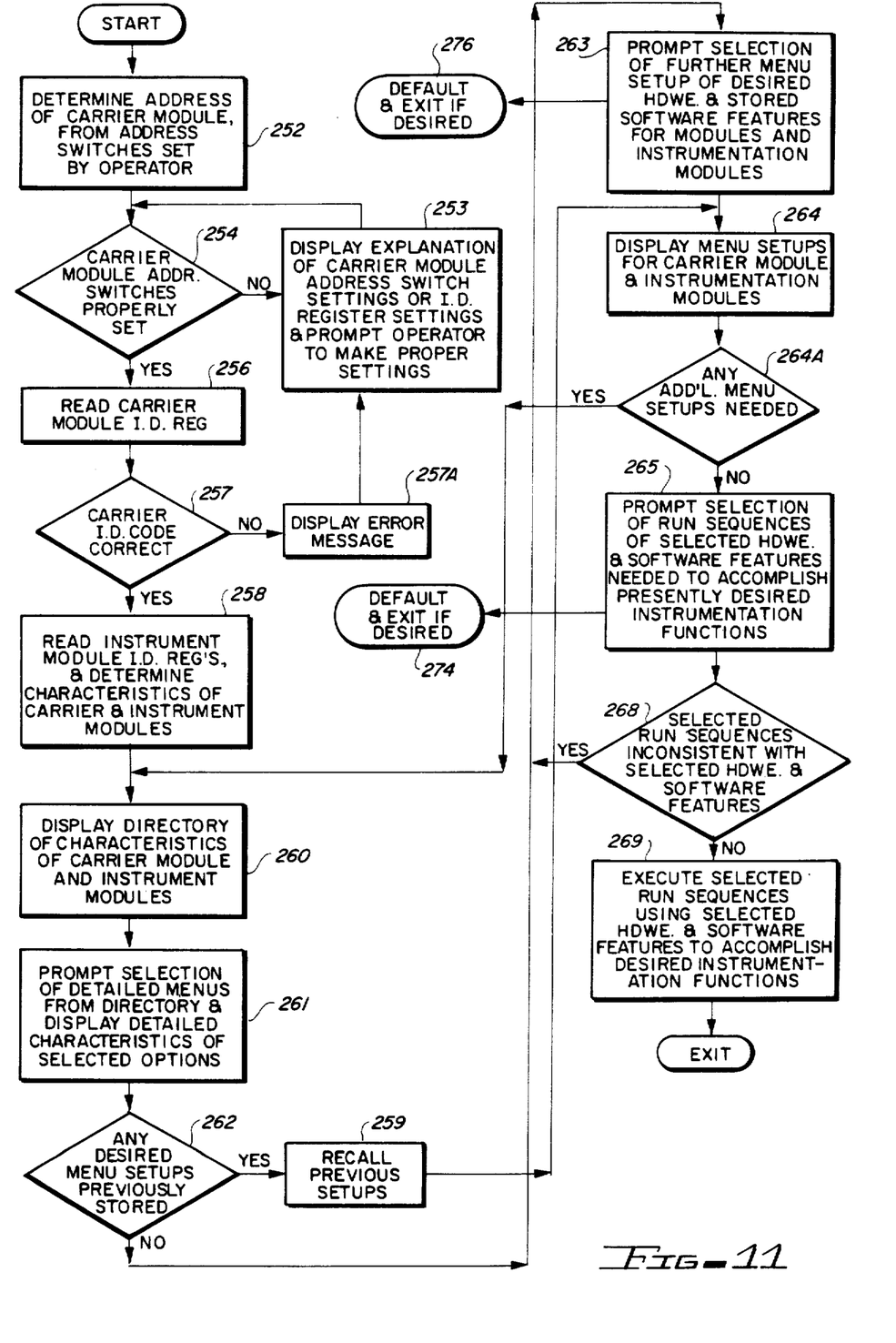

It is best to now refer to the flow chart of FIG. 11 which describes an exemplary program for execution by the host computer with the instrument carrier circuitry 2A of FIG. 3 plugged into a bus connector thereof, and that carrier module 2A having a plurality of instrument modules plugged therein. The program of FIG. 11 is started by entering block 252, wherein the host computer executes a subroutine to read the setting of the address switches 53 (FIG. 3) of the carrier module 2A which have been previously set. (It should be appreciated that the host computer has to have memory address space "ranges" set up, and for carrier module circuitry 2A, this must be done by proper setting of the address switches 53.) The program of FIG. 11 then enters decision block 254 and determines if the carrier module switches 53 are properly set. This is done by reading the identification register 62 of the carrier module 24 (FIG. 3) and comparing it with stored known valid identification information. If the determination of decision block 254 is negative, the program goes to block 253 and causes a display to be made, explaining the proper carrier module address switch setting procedure, or the proper settings of the identification registers of the carrier module and/or the instrumentation modules, as will be subsequently made clear. The program then returns to decision block 254, and, if its determination is affirmative, enters block 256.

In block 256, the program reads the carrier module identification register 62 (FIG. 3). If there is an error in the carrier modules identification register setting, as determined by decision block 257, the program enters block 257A, displays an error message, and then enters block 253 to display an explanation of the proper identification register settings and prompts the operator to make the proper settings. If the determination of decision block 257 is affirmative, the program enters block 258.

In block 258 the program causes the host computer to read all of the instrument module identification registers and thereby determine the characteristics of the carrier module and all of the instrument modules therein. The program then goes to block 260 and displays a directory of characteristics or menus of the carrier module and instrument modules plugged therein.

Next, the host computer routine enters block 261 and prompts the operator to select from the displayed directory those detailed menus from which he wishes to make selections of options in order to accomplish the presently desired instrumentation function for the host computer.

Next, the program enters decision block 262 and determines if any of the desired "menu setups" desired by the operator have been previously made and stored. If this determination is affirmative, the program goes to block 259 and recalls the previous menu setups from the disc on which the previous menu setup has been stored, and then goes to block 264.

If the determination of decision block 262 is negative, the program goes to block 263 and prompts the operator to make further menu setup selections as necessary to select the desired hardware features of the carrier module and instrument modules and any software features associated therewith. If at some point in this procedure the operator wishes to exit, he can do so, as indicated by label 276. Otherwise, the program goes from block 263 to block 264 and displays the menu setups presently selected or recalled for the present carrier module and the three instrument modules connected thereto. The program then goes to decision block 264A and determines if any additional menu setups and required in order to accomplish the needed instrumentation function for the host computer. If this determination is affirmative, the program returns to block 260, but otherwise goes to block 265.

In block 265, the program prompts the operator to select the "run sequences" necessary in order to make the previously selected hardware features and software features of or associated with the carrier module 2A and instrumentation modules thereon, in order to make them cooperate and interact to accomplish the presently desired instrumentation function. An example of what the run sequences can consist includes a sequence of reading an analog voltage proportional to a steam pressure in a vessel, determining if the value is within a present range, and generating a digital output signal in order to open or close a control valve in order to bring the steam pressure to a desired value. In this procedure, the operator can exit the program if he desires, as indicated by label 274. Otherwise, the program goes to decision block 268 and determines if the above selected run sequences are inconsistent with the previously selected or recalled menu setup of hardware and software features. If his determination is affirmative, the program goes back to block 263. and also displays appropriate error indicating the inconsistencies. If the determination of decision block 268 is negative, the program goes to block 269 and executes the selected run sequences, using the selected hardware features and software features of and associated with the carrier module 2A and instrumentation modules thereon to thereby accomplish the desired instrumentation function of the host computer with the carrier module and instrumentation modules. The program is then exited. Appendix B attached hereto is a listing of a program represented by the flow chart of FIG. 11.

Figure 10:
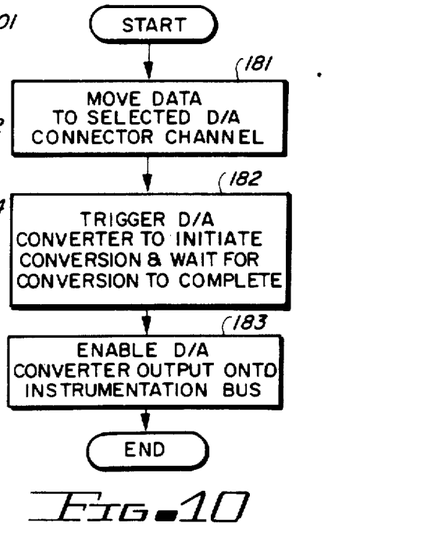

FIGS. 9 and 10 are flow charts of programs that can be executed by the host processor to effectuate operations of analog input or data acquisition instrument module 84 of FIG. 6 and the analog output or function generator module 65 of FIG. 5, respectively.

For the routine of FIG. 9, operation is started by entering block 201, wherein the host computer selects the particular multiplexer channel if single ended input operation is desired, or both channels 85 and 86 of FIG. 6 is differential input operation is desired. The program then enters block 202 and generates the necessary signal on conductor 108 of FIG. 6 to initiate conversion of the analog signal produced at the output of sample and hold circuit 100 into a 12 bit digital output on the digital outputs of analog digital converter 101. A subroutine that could be easily implemented by one skilled in the art to accomplish multiplexing of the three "nibbles" of the twelve bit digital output of analog to digital converter onto the 8 conductors of the buffered bidirectional data bus 102 can be easily implemented by one skilled in the art, and the details are not set forth, as they are not critical to the practice of the invention and can be implemented in a variety of ways.

Next, the program enters decision block 203 and, if necessary, waits as indicated by loop 204, until the analog to digital conversion process by analog to digital converter 101 is complete. The program then goes to block and causes the host computer to buffer the 12 bit digital equivalent of the analog input signal onto instrumentation bus 7 and fetch this information and store it in the memory of the host processor, from which it can be used, if necessary, to accomplish the desired instrumentation function or use the results of the instrumentation function for some other purpose. Appendix C is a listing of the routine represented by the flow chart of FIG. 9.

Referring now to the flow chart of FIG. 10, the host computer effectuates operation of the analog output or function generator module 65 of FIG. 5 by entering block 181. In block 181, the host computer outputs addresses on the instrumentation bus 7 to cause decode circuit 77 to select the ones of digital to analog converters 72 and 79 that are required to accomplish the presently desired instrumentation function and also generates the needed ME* signal and the desired data on conductors D0–D7 of the instrumentation bus to load buffer 66 and apply the digital data to be converted to analog form to the digital inputs of digital to analog converters 72 and 79.

Next, the program enters block 182 and generates the needed signal on the WRT* conductor to initiate the digital to analog conversion process by the presently selected one or ones of digital to analog converters 72 and 79 and waits for the conversion to be complete. The program then enters block 183 and enables the resulting analog output signal to be enabled onto the appropriate one of conductors 75 or 83. The routine is then exited. Appendix D is a listing of the routine of the program represented by the flow chart of FIG. 10.

The invention provides a personal computer or host computer with a good deal more versatility and instrumentational functionality than any prior dedicated instrumentational system for personal computers known to date. The unique, "standardized" instrumentation bus, with its digital portion and segmented analog portions and plurality of identical instrumentation bus connectors, each of which receives any of a family of instrument modules which contain various instrumentation operation capabilities combined with capabilities of the host processor or personal computer program of reading identification registers of the plugged in instrument modules, capabilities of the presently plugged-in instrument modules, of prompting selection of a desired set of instrumentation capabilities from available run sequences, provides the user with many (i.e., hundreds of) different instrumentation system configurations that can be provided for a personal computer at a very low cost. The unique "daisy chained" analog bus segments allow one instrument module to condition a signal and then pass a process signal onto the next segment, thereby providing one or more "extendable" analog buses, and thereby avoid problems associated with lack of modularity of previous plug-in instrumentation systems for personal computers, and avoids the need to provide "customized" wiring for routing of analog signals. In order to make the instrumentation system of the present invention adaptable to various different personal computers that presently are commercially available, only the carrier module design needs to be varied. The entire family of instrument modules can be plugged into any particular carrier module without any redesign at all. The almost instant reconfigurability and the flexibility of the instrumentation system of the present invention makes it an ideal instrumentation tool for numerous commercial and laboratory uses. For example, instead of spending valuable engineering time to design a data acquisition system, the desired functions can be easily set up by simply plugging in a group of instrument modules having the desired basic capabilities, selecting the capabilities that are needed in response to the prompting and establishing a run sequence in response to the prompting.

While the invention has been described with reference to several particular embodiments thereof, those skilled in the art will be able to make various modifications to the described embodiments without departing from the true spirit and scope of the invention. All variations which perform substantially the same work in substantially the same way to achieve substantially the same result are considered to be within the scope of the invention.

We claim:

1. An instrumentation system, for connection to a connector of a digital bus of a host computer, comprising in combination:
(a) a carrier module having a host computer digital bus connector for mating with said digital bus connector;
(b) an instrumentation bus disposed on said carrier module, said instrumentation bus including a digital portion and a segmented analog portion;
(c) a plurality of instrument module connectors electrically connected to said instrumentation bus, said digital portion of said instrumentation bus including a plurality of conductors each coupled to a corresponding terminal conductor of a respective one of said instrument module connectors, each segment of said segmented analog portion of said instrumentation bus including an analog bus segment connector connected to a respective input terminal conductor of one of said instrument module connectors and a respective output terminal conductor of another one of said instrument module connectors;

(d) interface circuit means coupled to said host computer digital bus connector and to said digital portion of said instrumentation bus for reconfiguring and/or reformatting digital data received from one of said digital bus of said host computer on said digital portion of said instrumentation bus and outputting the reconfigured and/or reformatted digital data to the other of said digital bus of said host computer and said digital portion of said instrumentation bus; and (e) a plurality of instrument module means, each plugged into a respective one of said instrument module connectors, for receiving an analog signal from a conductor of one segment of said segmented analog bus portion, and transmitting a modified version of that analog signal to another conductor of another segment of said segmented analog portion, each instrument means including means for operating on its received analog signal to produce the modified version.

2. The instrumentation system of claim 1 wherein said segmented analog portion of said instrumentation bus includes a plurality of analog bus segments, each of said analog bus segments including a plurality of analog bus segment conductors, each of said analog bus segment conductors being connected to a respective analog output terminal conductor of one of said instrument module connectors and to a respective analog input terminal conductor of another of said instrument module connectors to extend the segmented analog portion from one of the instrument module means to another instrument module means.

3. The instrumentation system of claim 2 wherein each of said instrument module means has an internal digital bus structure that is identical to the bus structure of said digital portion of said instrumentation bus, in order to allow any of said instrument module means to be plugged into one of said instrument modules connectors regardless of any differences between the bus structure of said host computer digital bus and the bus structure of said digital instrumentation bus.

4. The instrumentation system of claim 3 wherein at lest one of said instrument module means receives a first analog input signal from a first analog bus segment conductor via the instrument module connector to which that instrument module means is connected and transmits a modified first analog input signal to a second analog bus segment conductor via that instrument module connector to extend said first analog bus segment, and wherein that one instrument module means includes means for operating on said first analog signal to produce said modified first analog input signal.

5. The instrumentation system of claim 4 wherein at least a first one of said plurality of instrument module means includes a cable connector, and a cable connecting said cable connector to an external piece of equipment that is being monitored and/or controlled by said host computer, in accordance with an instrumentation function being performed by said first instrument module means.

6. The instrumentation system of claim 5 wherein said first instrument module means includes means for sending and/or receiving an analog signal to and/or from said external piece of equipment via said cable.

7. The instrumentation system of claim 5 wherein said first instrument module means includes means for sending and/or receiving digital information to and/or from said external piece of equipment via said cable.

8. The instrumentation system of claim 5 wherein each of said instrument module means includes a printed circuit board, and said instrument module connectors each rigidly support a respective one of said plurality of instrument module means so that a plane of the printed circuit board of each of said instrument module means is parallel to a plane of said carrier module.

9. The instrumentation system of claim 5 wherein said carrier module and each of said instrumentation module means includes identification register means for storing information indicative of instrumentation operation capabilities or functions that said carrier module and said instrumentation module means can perform, respectively, and means for coupling said stored information to said digital portion of said instrumentation bus to allow said host computer to read said stored information.

10. The instrumentation system of claim 9 wherein said carrier module includes address storage means for storing a predetermined address assigned to said carrier module and address comparison means coupled to said host computer digital bus and said address storage means for producing an enable signal if said predetermined address matches an address being output by said host computer.

11. The instrumentation system of claim 10 wherein said host computer digital bus includes address conductors, and wherein said carrier module includes a plurality of buffer circuit means coupled to said host computer digital bus and to said digital portion of said instrumentation bus for providing buffering between corresponding data bus conductors of said host computer digital bus and said digital instrument bus, and providing buffering between some of the address conductors of said host computer digital bus and corresponding address conductors of said digital instrumentation bus, and wherein said carrier module also includes means for generating function selection signals by decoding address signals produced by said host computer on others of said address conductors of said host computer digital bus.

12. The instrumentation system of claim 11 wherein said carrier module includes decoding means for decoding addresses on said other address conductors of said host computer digital bus to generate enable signals for enabling said buffering circuit means and module enable signals for enabling various functional blocks of various ones of said instrument module means, respectively.

13. The instrumentation system of claim 10 wherein said carrier module inclues processor means for executing stored instructions, memory means for storing information and communicating information with said processor means, and dual port memory means coupled between said host computer digital bus and said digital instrumentation bus to effectuate operation of said instrumentation module means in response to said processor means.

14. The instrumentation system of claim 10 wherein one of said plurality of instrument module means includes digital to analog conversion means for receiving digital information from said digital instrumentation bus and converting it to an analog signal and outputting it to an analog bus segment conductor of said instrumentation bus.

15. The instrumentation system of claim 14 wherein said one of said plurality of instrument module means include memory storage means for storing a plurality of instructions which can be executed by a processor to cause digital information to be input to said digital to analog conversion means in a sequence that causes said digital to analog conversion means to output a predetermined analog waveform.

16. The instrumentation system of claim 10 wherein one of said instrument module means includes multiplexing means coupled to a cable conducting a plurality of external analog signals on a plurality of analog conductors, respectively, for selecting one or more of said external analog signals that is determined by data from said instrumentation data bus to an input of a programmable gain amplifier, and analog to digital conversion means for converting the selected and amplified analog signal to a representative digital number and outputting that digital number to said digital portion of said instrumentation bus.

17. The instrumentation system of claim 16 wherein said one of said instrument module means includes memory means for storing a plurality of instructions which can be executed by a processor to effectuate a predetermined sequence of selecting analog signals from said cable and converting them to representative digital numbers which are output onto said digital portion of said instrumentation bus.

18. The instrumentation system of claim 10 wherein one of said instrument module means inclues clock signal generating means for generating an internal clock signal and programmable counting circuit means for performing counting functions in response to said internal clock to generate timing signals and also includes means for generating function signals in response to signals received via said instrumentation bus, said timing signals and said function signals being available for external use.

19. The instrumentation system of claim 1 wherein said instrumentation bus includes a plurality of data bus conductors, a plurality of address conductors and a plurality of control conductors.

20. The instrumentation system of claim 19 wherein said control conductors include a module present signal conductor, a read signal conductor a write signal conductor, an interrupt signal conductor, and analog ground conductor, a digital ground conductor, and at least a pair of segmented analog bus conductors.

21. The instrumentation system of claim 1 wherein said interface circuit means includes means for synchronizing operation of said host computer with data transmitted on said digital portion of said instrumentation bus by one of said instrument module means.

22. The instrumentation system of claim 9 further including means in said host computer for causing said host computer to read said identification register means in each of said instrument module means and said carrier module to enable said host computer to select from a memory in said host computer stored menus of functions of said instrument module means and said carrier modules.

23. The instrumentation system of claim 22 further including means located in said host computer for causing said host computer to access a plurality of stored look-up locations determined by the read contents of said identification register means to obtain a menu of all available instrumentation operation capabilities of the plugged in instrumentation module means.

24. The instrumentation system of claim 23 further including means located in said host computer for prompting a user to select desired instrumentation operation capabilities from said menu.

25. The instrumentation system of claim 24 further including instruction means stored in said host computer for causing said host computer to build a list of selected instrumentation operation capabilities from a stored look-up table in response to selection by an operator, and means in said host computer for causing a processor to access stored look-up table locations determined by that list and fetching from those locations a menu of available run sequences for the selected instrumentation operation capabilities, and means in the host computer for displaying and prompting selection of desired run sequences from that menu.

26. The instrumentation system of claim 25 further including instruction means stored in said host computer for causing a processor to build a list of selected run sequences and accessing memory locations defined in that list to fetch stored subroutines determined by items of that list and means stored in said host computer for causing said host computer to execute those subroutines to perform the selected instrumentation capability for said host computer.

27. The instrumentation system of claim 26 wherein said processor is said host processor.

28. The instrumentation system of claim 26 wherein said processor includes a processor means included in said carrier module for executing stored instructions and communicating with said host processor and a memory means for storing information.

29. A method of operating a host computer having a digital bus to add a variety of instrumentation capabilities to said host computer, said method comprising the steps of:

(a) providing a plurality of instrument modules each having a plurality of different analog conversion circuits and/or digital conversion circuits and each having an identical plug-in connector, and providing a carrier module having an instrumentation bus including a digital portion and a segmented analog portion, and a plurality of identical instrumentation bus connectors connected to said instrumentation bus for receiving said plug-in connectors, each segment of said analog portion having a plurality of analog conductors extending between noncorresponding conductors of a respective pair of said instrumentation bus connectors, and plugging a selected group of said instrument modules into various ones of said instrumentation bus connectors, and plugging said carrier module into a vacant bus connector of the host computer;

(b) causing said host computer to read identification registers in each of said instrument modules, and causing circuitry in said carrier module to buffer, reconfigure, and synchronize flow of digital information between the digital portion of said instrumentation bus and the digital bus of said host computer, and causing said host computer to access locations of stored look-up tables determined by the read contents of said identification registers to provide a menu of available instrumentation operation capabilities from the plugged in instrumentation modules, and selecting desired ones of said instrumentation operation capabilities from the menu;

(c) producing a first list of selected instrumentation operation capabilities, and selecting from a stored look-up table a menu of available run sequences for the selected instrumentation operation capabilities, and selecting a plurality of desired run sequences;

(d) building a second list of selected run sequences and accessing a memory in said host computer, referring to that list, to fetch stored subroutines determined by items of said second list; and (e) executing those subroutines to provide the selected instrumentation capability or group of capabilities by said host computer.

30. The method of claim 29 wherein said synchronizing of step (b) includes producing a wait signal and applying it to said host computer to delay operation of said host computer for a predetermined time to allow completion of an operation in one of said instrument modules.

31. The method of claim 29 wherein step (b) includes causing said host computer to access locations of said memory determined by the read contents of said identification register to provide a directory of menus of available instrumentation capabilities from the plugged in instrument modules, and causing said host computer to prompt selection of said menu from those displayed.

32. The method of claim 31 wherein step (c) includes determining if said first list has been previously produced and stored, and if that determination is affirmative, then recalling the stored first list.

33. The method of claim 29 wherein step (e) includes conducting analog and/or digital information between one of said instrument modules and an external device by means of a cable.

34. The method of claim 29 wherein step (b) includes displaying said menu of available instrumentation operation capabilities of said instrument modules in said menu and displaying messages to prompt a user to select said desired instrumentation operation capabilities from said menu.

35. The method of claim 34 wherein step (c) includes displaying said first list and displaying messages to prompt a user to select desired run sequences from said first list.

36. A method of operating a plurality of different host computers each having a different kind of bus to add a variety of instrumentation capabilities to said host computer, said method comprising the steps of:

(a) providing a plurality of instrument modules each having a plurality of different analog conversion circuits and/or digital conversion circuits and each having an identical plug-in connector, and providing a plurality of carrier modules each having an identical instrumentation bus and a plurality of identical instrumentation bus connectors connected to said instrumentation bus for receiving said plug-in connectors, and plugging a selected group of said instrument modules into various ones of said instrument bus connectors of each of said carrier modules, and plugging one of said carrier modules into a vacant bus connector of the host computers;

(b) causing each of said host computers to read identification registers in each of said instrument modules, and causing circuitry in said carrier modules to buffer, reconfigure and synchronize flow of digital information between the identical instrumentation buses and the different types of digital buses of said respective host computers, and causing each of said host computers to access locations of stored look-up tables determined by the read contents of said identification registers to provide a menu of available instrumentation operation capabilities from the instrumentation modules plugged into the carrier modules plugged into that host computer, and selecting desired ones of said instrumentation operation capabilities from the menu;

(c) in each host computer, producing a first list of selected instrumentation operation capabilities, and selecting from a stored look-up table a menu of available run sequences for the selected instrumentation operation capabilities, and selecting a plurality of desired run sequences;

(d) in each host computer, building a second list of selected run sequences and accessing a memory located in said host computer, referring to that list, to fetch stored subroutines determined by items of that second list; and (e) causing each of the host computers to execute those subroutines to provide the selected instrumentation capability or group of capabilities by said host computer.

* * * * *

UNITED STATES PATENT AND TRADEMARK OFFICE
CERTIFICATE OF CORRECTION

PATENT NO. : 4,683,550

DATED : July 28, 1987

INVENTOR(S) : James A. Jindrick et al.

It is certified that error appears in the above-identified patent and that said Letters Patent is hereby corrected as shown below:

Column 18, Claim 1, line 64, "connector" should read -- conductor --.

Signed and Sealed this

First Day of December, 1987

Attest:

DONALD J. QUIGG

Attesting Officer      Commissioner of Patents and Trademarks